US009385089B2

(12) United States Patent
Hong et al.

(10) Patent No.: US 9,385,089 B2
(45) Date of Patent: Jul. 5, 2016

(54) ALIGNMENT MARK RECOVERY WITH REDUCED TOPOGRAPHY

(71) Applicant: Seagate Technology LLC, Cupertino, CA (US)

(72) Inventors: Dongsung Hong, Edina, MN (US); Lijuan Zou, Eden Prairie, MN (US); Daniel Sullivan, Carver, MN (US); Lily Horng Youtt, Eagan, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 13/753,792

(22) Filed: Jan. 30, 2013

(65) Prior Publication Data

US 2014/0210113 A1    Jul. 31, 2014

(51) Int. Cl.
  *H01L 21/76*  (2006.01)
  *H01L 21/46*  (2006.01)
  *H01L 23/544* (2006.01)

(52) U.S. Cl.
  CPC ..... *H01L 23/544* (2013.01); *H01L 2223/54426* (2013.01); *H01L 2223/54453* (2013.01); *H01L 2924/0002* (2013.01)

(58) Field of Classification Search
  CPC .......... H01L 25/0657; H01L 2924/01078; H01L 2924/01079; H01L 2924/14; H01L 2924/01013; H01L 2924/15311; H01L 2224/48091; H01L 2224/16; H01L 2224/73253; H01L 23/4334; H01L 2224/48247
  USPC ............. 257/797, 91, 98, 283; 438/401, 462, 438/975
  See application file for complete search history.

(56) References Cited

U.S. PATENT DOCUMENTS

| 5,682,190 | A  | * | 10/1997 | Hirosawa et al. ............... 347/94 |
| 6,696,220 | B2 |   | 2/2004  | Bailey et al.   |
| 6,884,551 | B2 |   | 4/2005  | Fritze et al.   |
| 7,766,640 | B2 |   | 8/2010  | Stewart et al.  |
| 7,805,826 | B1 |   | 10/2010 | Spillane        |
| 8,241,535 | B2 |   | 8/2012  | Yanagisawa      |
| 2002/0096359 | A1 |   | 7/2002  | Hsu et al.      |
| 2002/0115002 | A1 |   | 8/2002  | Bailey et al.   |

(Continued)

FOREIGN PATENT DOCUMENTS

| EP | 1837705 A2    | 9/2007  |
| JP | 2004-286892 A | 10/2004 |

OTHER PUBLICATIONS

Scheer, Hella-Christin Pattern Defintion by Nanoimprint; Proc. SPIE vol. 8428, Micro-Optics 2012, 842802 (Jun. 1, 2012), pp. 1-15.

(Continued)

*Primary Examiner* — A. Sefer
*Assistant Examiner* — Dilinh Nguyen
(74) *Attorney, Agent, or Firm* — HolzerIPLaw, PC (57) ABSTRACT

When opaque films are deposited on semi-conductor wafers, underlying alignment marks may be concealed. The re-exposure of such alignment marks is one source of resulting surface topography. In accordance with one implementation, alignment marks embedded in a wafer may be exposed by removing material from one or more layers and by replacing such material with a transparent material. In accordance with another implementation, the amount of material removed in an alignment mark recovery process may be mitigated by selectively ashing or etching above a stop layer.

17 Claims, 11 Drawing Sheets

(56) References Cited

U.S. PATENT DOCUMENTS

| | | |
|---|---|---|
| 2004/0189994 A1 | 9/2004 | Sreenivasan et al. |
| 2004/0257552 A1 | 12/2004 | Hansen |
| 2005/0186753 A1* | 8/2005 | Chen et al. .................... 438/401 |
| 2005/0238965 A1 | 10/2005 | Tyrrell et al. |
| 2005/0250243 A1 | 11/2005 | Bonnell et al. |
| 2006/0032437 A1 | 2/2006 | McMackin et al. |
| 2006/0072090 A1 | 4/2006 | Bakker |
| 2006/0150849 A1 | 7/2006 | Van Santen et al. |
| 2006/0204865 A1 | 9/2006 | Erchak et al. |
| 2006/0221440 A1 | 10/2006 | Banine et al. |
| 2006/0230959 A1 | 10/2006 | Meijer et al. |
| 2006/0266244 A1 | 11/2006 | Kruijt-Stegeman et al. |
| 2006/0290017 A1 | 12/2006 | Yanagisawa |
| 2007/0082457 A1 | 4/2007 | Chou et al. |
| 2007/0138699 A1 | 6/2007 | Wuister et al. |
| 2007/0159718 A1 | 7/2007 | Kim et al. |
| 2007/0228609 A1 | 10/2007 | Sreenivasan et al. |
| 2008/0043360 A1 | 2/2008 | Shimazawa et al. |
| 2008/0264185 A1 | 10/2008 | Kobayashi et al. |
| 2008/0308971 A1 | 12/2008 | Liu et al. |
| 2009/0017580 A1 | 1/2009 | Smith |
| 2010/0077600 A1 | 4/2010 | Seki et al. |
| 2010/0096256 A1 | 4/2010 | Nalamasu et al. |
| 2010/0104768 A1 | 4/2010 | Xiao et al. |
| 2010/0224876 A1* | 9/2010 | Zhu ................... H01L 21/76898 257/52 |
| 2011/0006400 A1* | 1/2011 | Souriau et al. ................. 257/618 |
| 2011/0037201 A1 | 2/2011 | Koole et al. |
| 2011/0104322 A1 | 5/2011 | Park et al. |
| 2011/0146568 A1 | 6/2011 | Haukka et al. |
| 2011/0268869 A1 | 11/2011 | Dijksman et al. |
| 2011/0286127 A1 | 11/2011 | Gao et al. |
| 2012/0061732 A1* | 3/2012 | Hirai et al. ..................... 257/211 |
| 2012/0112385 A1 | 5/2012 | Sreenivasan et al. |
| 2012/0300202 A1 | 11/2012 | Fattal et al. |
| 2013/0214452 A1 | 8/2013 | Choi et al. |
| 2014/0154471 A1 | 6/2014 | Kodama et al. |

OTHER PUBLICATIONS

Malloy, Matt and Litt, Lloyd Technology Review and Assessment of Nanoimprint Lithography for Semiconductor and Patterned Media Manufacturing; Journal of Micro/Nanolithography, MEMS, and MOEMS, Jul.-Sep. 2001/vol. 10, pp. 1-14.

International Search Report and Written Opinion of PCT/US2014/013801 mailed May 20, 2014.

* cited by examiner

ALIGNMENT MARK RECOVERY WITH REDUCED TOPOGRAPHY

SUMMARY

Implementations described and claimed herein provide for semi-conductor wafer alignment mark recovery processes that yield reduced surface topography. In accordance with one implementation, an alignment mark recovery process includes creating a cavity by removing opaque material oriented over an alignment mark embedded in a wafer to expose the alignment mark and thereafter filling the cavity with a transparent material to a depth substantially equal to the depth of the cavity.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

DETAILED DESCRIPTION

NanoImprint lithography (NIL) offers advanced pattern fidelity similar to ebeam lithography, but is significantly faster and offers throughput similar to optical lithography. Unlike optical lithography patterning, NIL requires direct contact between a wafer and a template mask that is pressed against the wafer. This direct contact permits capillary forces to draw droplets of liquid photoresist on the wafer into patterned grooves on the template mask. However, when significant topography is present on the wafer prior to NIL imprinting, such capillary forces may be insufficient to draw the liquid photoresist into the cavities. In such cases, NIL imprinting can be problematic.

As used herein, the term "significant surface topography" refers to features created on the surface of a wafer that are large enough to prevent the NIL template from making direct and substantially uniform contact with a photoresist on the wafer during NIL patterning. Typically, this type of direct contact between the wafer and the NIL template is prevented when one hundred or more nanometers of topography are present on the surface of the wafer. Alignment mark recovery processes are one source of surface topography on semi-conductor and thin film head wafers Alignment marks are visible marks made on or embedded in a semi-conductor wafer that can be used to align the wafer with a template mask (in the case of NIL patterning) or a photo mask (in the case of optical lithography patterning). However, the alignment marks may be concealed when one or more opaque film layers are deposited on the wafer. Therefore, some semi-conductor processes include steps to remove the opaque films in the region over the alignment marks after they are concealed. For example, the opaque layers may be milled or etched away in some areas to recover (i.e., expose or make visible) the alignment marks. However, these milling or etching processes typically create significant surface topography.

Although polishing processes can remove some surface topography, polishing is time consuming and can create wafer uniformity problems. Additionally, polishing is not always time or cost efficient. Implementations of the methods disclosed herein significantly reduce surface topography created by alignment mark recovery processes. Consequently, the amount of polishing required after performing such a process is reduced or eliminated.

Figure 1:
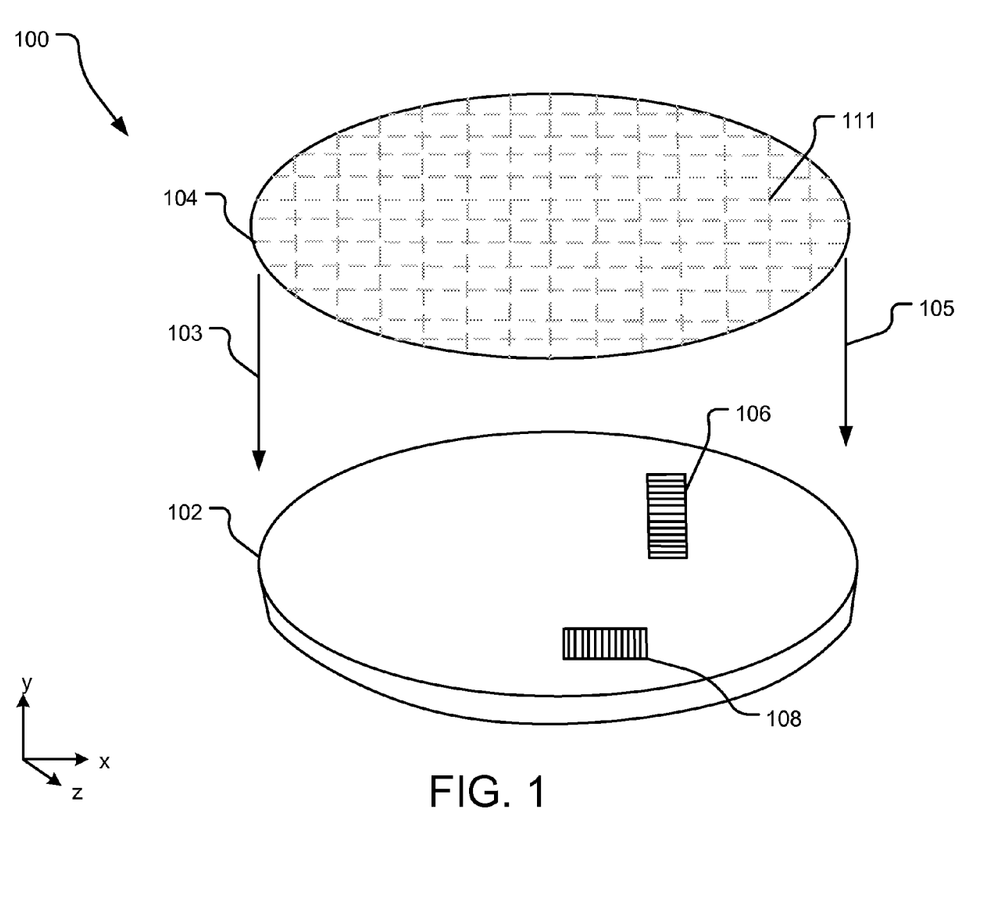
FIG. 1 illustrates an alignment of a patterned template with a semi-conductor wafer using alignment marks.

FIG. 1 illustrates an alignment 100 of a patterned template mask 104 with a wafer 102 using alignment marks 106 and 108. In one implementation, this alignment is performed as part of a NIL patterning step. The template mask 104 is a rigid, transparent plate with a grooved pattern on a wafer-facing side (e.g., the grooved pattern on the underside of the template mask 104 exemplified by dotted lines 111). In another implementation, the template 104 is of square or rectangular shape and sized such that it can "stamp" several different non-overlapping areas within the wafer 102 (i.e., a "step-and-repeat" process)

The wafer 102 is a substrate with a variety of layers formed thereon to perform a variety of different functions. Each of the layers on the wafer 102 may be independently formed, such as through a spin-coating, deposition, or a plating process. To create structures or patterns in one or more layers on the wafer 102, a template mask (such as the template mask 104) can be used to create a patterned photoresist (not shown) on the wafer 102 that will "mask" and thus protect certain portions of the wafer 102 during one or more layer application processes.

In one implementation, the template mask 104 is a transparent template suitable for NIL imprinting on the wafer 102. A patterned photoresist is created on the wafer 102 by applying a template-facing side of the wafer with droplets of a liquid photoresist (not shown) and by bringing the template mask 104 into contact with the wafer 102 so that the droplets of photoresist on the wafer are pulled into the grooved patterns 111 on the template mask 104 by capillary forces. However, before the template mask 104 and the wafer 102 are brought into contact with one another, the template mask 104 and the wafer 102 are aligned using one or more alignment marks 106, 108 on the wafer (as illustrated by arrows 103 and 105 in FIG. 1). After contact is made between the aligned wafer 102 and template mask 104, the liquid photoresist is hardened by an exposure to a high intensity light directed through the transparent template mask 104.

In another implementation, the template 104 is a photo mask suitable for use in an optical lithography patterning process. Here, a patterned photoresist may be formed on the wafer 102 by directing high intensity light through transparent portions of the photo mask and, subsequently, through a lens (not shown) to project an image or pattern onto a liquid layer of photoresist deposited on the wafer 102. However, before the liquid photoresist is exposed to the high intensity light, the template 104 and the wafer 102 are aligned using one or more alignment marks 106 and 108 on the wafer 102. In one implementation, the photo mask 104 is rectangular and corresponds to an exposure field on the wafer 102 that is considerably smaller than the surface of the wafer 102. Here, a patterned resist is formed by utilizing what is known as a "step-and-repeat" process, wherein the alignment and exposure processes are repeated for several positions of the photo mask until the photoresist is patterned across substantially the entire surface of the wafer 102.

In both of the above implementations, the alignment marks 106 and 108 are used to precisely align the template 104 with the wafer 102 prior to the NIL or optical lithography patterning process. In addition to optical lithography and NIL, alignment marks are commonly used in a variety of semi-conductor fields to which the herein disclosed implementations may also apply.

Multiple techniques may be employed to align the wafer 102 with the template mask 104. During one such alignment process, a wafer stage (not shown) supporting the wafer 102 is moved relative to a stationary laser beam (not shown). The passage of the alignment marks under the laser beam produces diffracted and scattered light, which is photo-electrically detected as an alignment signal.

In another alignment process, the alignment 106 and 108 marks are illuminated with a monochromatic light that is reflected and recorded by a CCD camera. The recorded signal can then be used to measure a photoelectric intensity or surface reflectivity as a function of position across the alignment mark. This signal can be correlated with a reference signal to give an amount of misalignment of the wafer 102 with a desired position.

However, these and other alignment processes may not be performed if the alignment marks are not visible. Thus, if one or more opaque thin film layers are deposited on the wafer above the alignment marks 106 and 108, then the alignment marks 106 and 108 may have to be recovered (i.e., re-exposed) prior to the alignment process. One way to do this is by etching or milling away at the opaque layers. However, etching or milling away at the opaque thin film layers over the alignment marks 106 and 108 can, in some cases, create surface topography unsuitable for subsequent NIL imprinting. Therefore, one solution is to replace opaque material removed from the wafer 102 with a transparent film. Another solution is to mitigate the amount of topography created by using a selective etching or ashing process. Such methods yield reduced surface topography as compared to traditional alignment mark recovery processes.

As used herein, the terms "transparent film" or "transparent material" may also refer to translucent films or materials.

In at least one implementation, the alignment marks 106 and 108 illustrated in FIG. 1 have been recovered according to a method disclosed herein that results in surface topography suitable for a subsequent NIL imprinting process. FIGS. 2-6 illustrate different steps that relate to the same or alternate implementations of an alignment mark recovery process that yields reduced surfaced topography as compared to existing methods.

Figure 2:
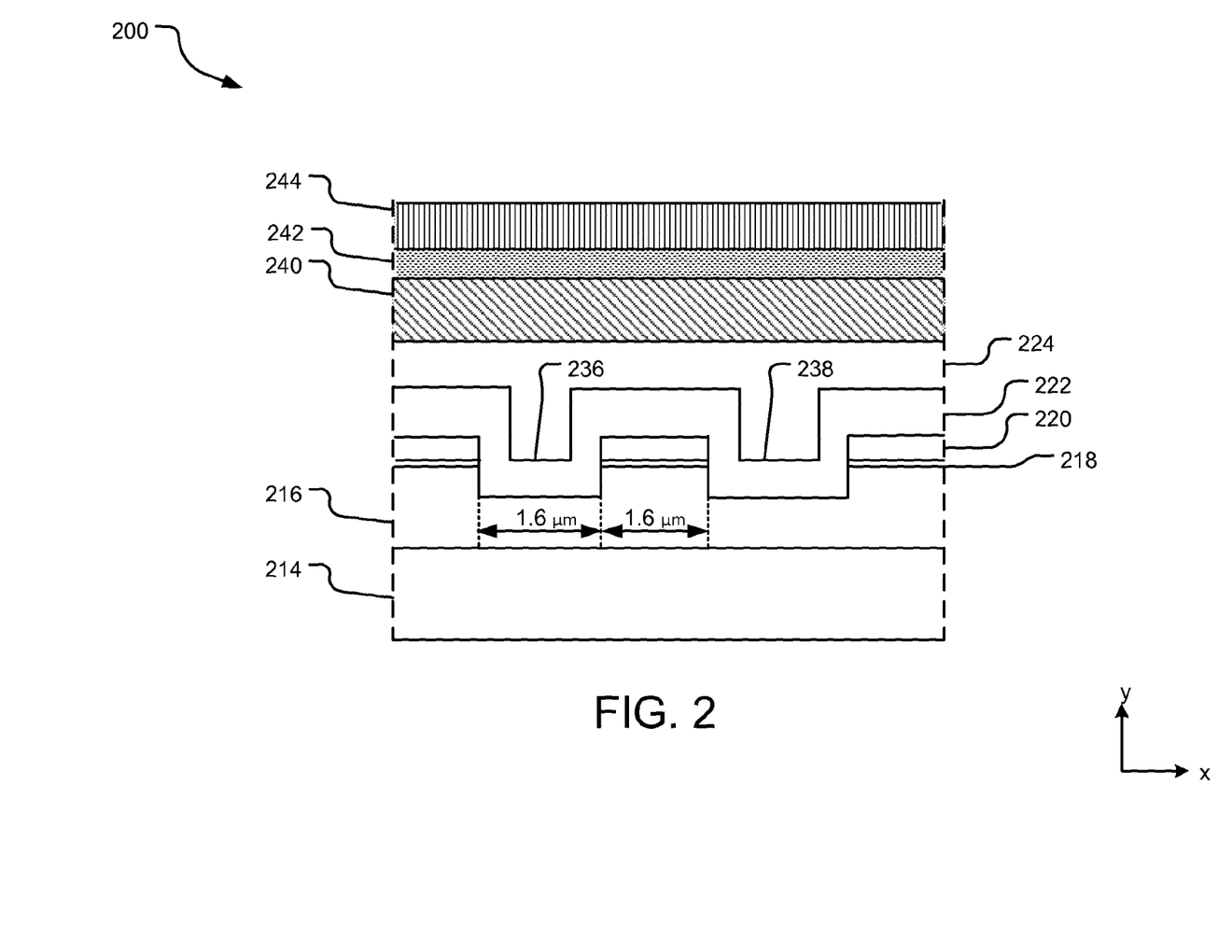
FIG. 2 illustrates a cross-sectional view of a semi-conductor wafer having a number of layers and embedded alignment marks.

FIG. 2 illustrates a cross-sectional view of a wafer 200 with a number of layers and alignment marks (e.g., alignment marks 236 and 238) embedded therein. Although the wafer 200 may be any semi-conductor wafer, the wafer illustrated is to be diced into thin film heads for use in hard drive disc assemblies. The wafer 200 includes a substrate layer 214 that is a hard, thermally stable material such as aluminum titanium carbide (AlTiC). A non-magnetic, nonconductive layer of basecoat 216 is formed on top of the substrate 214, which may be, for example, a layer of alumina. A thin resistive layer 218, which may be tantalum nitride (TaN), is formed on top of the basecoat 216, and a second layer of alumina 220 is formed on top of the thin resistive layer 218. In one example implementation, the substrate 214 is 1200 μm thick (y-direction); the basecoat 216 is approximately five microns thick; the resistive layer 218 is approximately six nanometers thick; and the second layer of alumina is approximately five microns thick.

Alignment marks 236 and 238 are formed in a metal layer 222 embedded in the wafer. In one implementation, this metal layer is NiFe. The metal layer 222 has a substantially even thickness across the wafer 200 and descends into a number of grooves formed in the wafer 200. The grooves in the wafer 200 splice through the underlying layers 218 and 220 and into the basecoat layer 216. Thus, the metal layer 222 also has a number of grooves formed therein that splice through the underlying layers 218 and 220 and into the basecoat layer 216. The grooves in the metal layer 222 are of a width (x-direction) that is substantially equal to the separation between the grooves. In various implementations, the width of each of the grooves may range between approximately 400 nanometers and four microns. The height (y-direction) of each of the grooves may range between approximately 800 nanometers and 20 microns. Widths and heights outside of these ranges are also contemplated herein.

The x-y cross-section of FIG. 2 shows each of the alignment marks 236 and 238 as a separate, single groove in the metal layer 222. However, an alignment mark typically includes a grouping of several grooves. In one implementation, an alignment mark includes between seven and seventeen grooves. In another implementation, the alignment mark includes as many as 90 grooves. Therefore, the alignment marks 226 and 238 may represent groupings of any number grooves.

A transparent layer 224 is on top of and in contact with the alignment mark layer 222. In one implementation, the transparent layer 224 is alumina. In another implementation, the transparent layer 224 is silicon dioxide ($SiO_2$). In yet another implementation, the transparent layer 224 is a layer of opaque material that is applied so thin as to allow for some light to be transmitted through the transparent layer 224. For example, the transparent layer 224 may be of a generally opaque material having thickness less than 50 nanometers.

A number of opaque film layers 240, 242, and 244 are formed on top of the transparent layer 224, concealing the underlying alignment marks 236 and 238. Here, the first opaque film layer 240 is a bottom shield layer that protects several more layers collectively forming a read/write stack (i.e., the second opaque film layer 242) from electromagnetic interference. The third opaque film layer 244 includes one or more hard mask layers to protect the read/write stack 242.

Prior to NIL or optical lithography printing, material from the opaque film layers 240, 242, and 244 may have to be removed in order to recover the underlying alignment marks 236 and 238.

Figure 3:
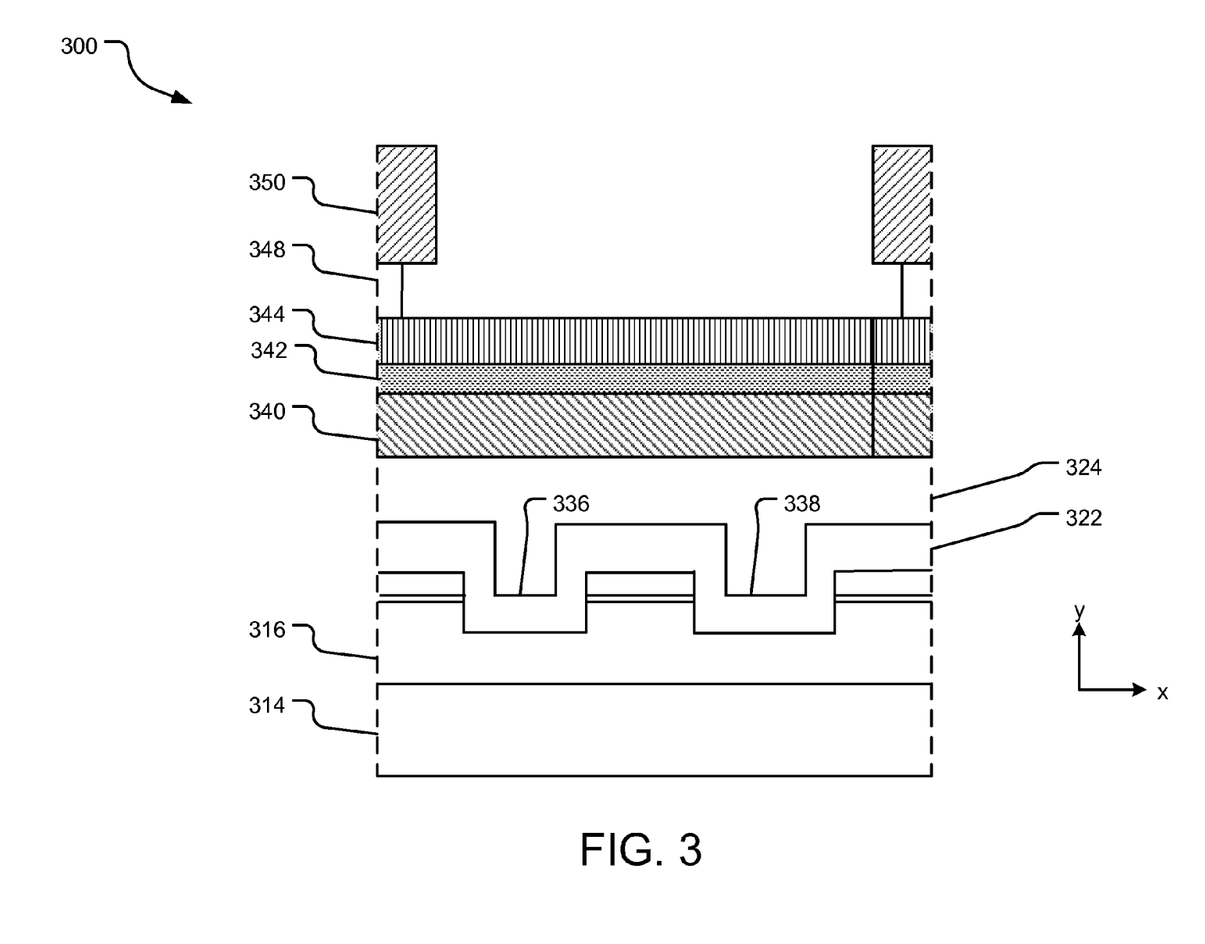
FIG. 3 illustrates another cross-sectional view of a semi-conductor wafer having a number of layers including a patterned photoresist layer on top of an undercut soluble polymer layer.

FIG. 3 illustrates another cross-sectional view of a wafer 300 having a number of layers including a patterned photoresist layer 350 on top of an undercut soluble polymer layer 348. The wafer 300 also has embedded alignment marks 336 and 338 underlying a transparent layer 324. The alignment marks 336 and 338 are grooves formed in a metal layer 322. Opaque layers 340, 342, and 344 are formed on top of the transparent layer 324, concealing the alignment marks 336 and 336.

The soluble polymer layer 348 and the overlying patterned layer 350 are formed on the wafer 300 during a preliminary step in an alignment mark recovery process. The soluble polymer layer 338 is applied to the wafer 300. In one implementation, the polymer layer 338 is applied via a spin-coating process. Thereafter, the wafer 300 is baked to drive off solvent. A layer of liquid photoresist 350 is then deposited, such as through a spin-coating or other deposition process, on top of the soluble polymer layer 348. The liquid photoresist 350 is patterned so as to leave exposed a portion of the wafer surface above the alignment marks 336 and 338 (as illustrated in FIG. 3). In one implementation, this patterning is done by an optical lithography process wherein portions of the liquid photoresist are exposed to high intensity light, thus changing the solubility of either the exposed or unexposed portions (depending upon the type of photoresist). The unchanged portions are removed by a developer solution, leaving behind the patterned photoresist layer 350.

The soluble polymer layer 348 is soluble in the developer solution used to remove the developable portions of the patterned photoresist layer 350. Thus, the soluble polymer layer 348 is isotropically dissolved beneath developed portions of the patterned photoresist. This effect causes the soluble polymer layer 348 to slightly undercut the patterned photoresist layer 350, as illustrated in FIG. 3. In one implementation, the soluble polymer is polymethylglutarimide (PMGI).

Because there may be some uncertainty as to the exact locations of the underlying alignment marks 336 and 338, the patterned photoresist layer 350 may be patterned to expose a substantial margin around the alignment marks 336 and 338. In one implementation, this margin is substantially between one and two microns on each side of the alignment marks 336 and 338. The patterned photoresist layer 350 functions to protect portions of the wafer 300 during a subsequent etching process (such as that described with respect to FIG. 4, below). After the etching process, the soluble polymer layer 348 and the patterned photoresist layer 350 can be removed. In one implementation, the soluble polymer layer 348 and the patterned photoresist 350 are removed by using standard photoresist solvents.

Figure 4:
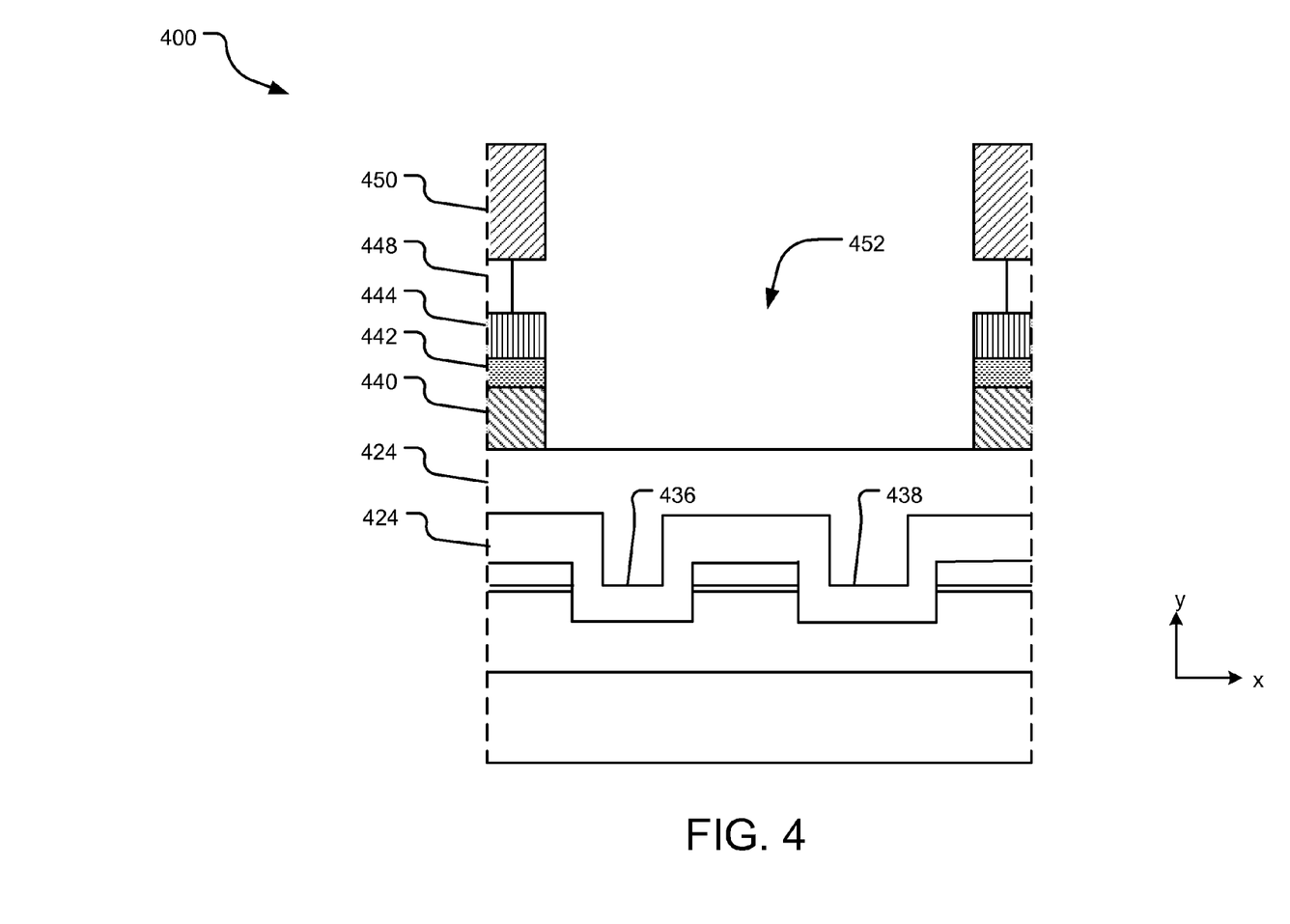
FIG. 4 illustrates another cross-sectional view of a semi-conductor wafer with a cavity etched therein to expose embedded alignment marks through a transparent layer.

FIG. 4 illustrates another cross-sectional view of a semi-conductor wafer 400 with a cavity 452 etched therein to expose embedded alignment marks 436 and 438 through a transparent layer 424. The cavity 452 has been milled or etched to remove material from a number of opaque layers 440, 442, and 444 in order expose the embedded alignment marks 436 and 438 below. Thus, the cavity 425 has a base with a perimeter that substantially surrounds the underlying alignment marks 436 and 438.

A soluble polymer layer 438 and overlying patterned photoresist 450 were formed on top of the opaque layers 440, 442, and 444 to protect the now un-etched portions of the wafer 400 during the milling or etching process.

In one implementation, the milling or etching process expands the cavity 452 into the underlying transparent layer 424 (i.e., in the y-direction) in order to ensure that the opaque films have been completely cleared from the transparent surface.

Figure 5:
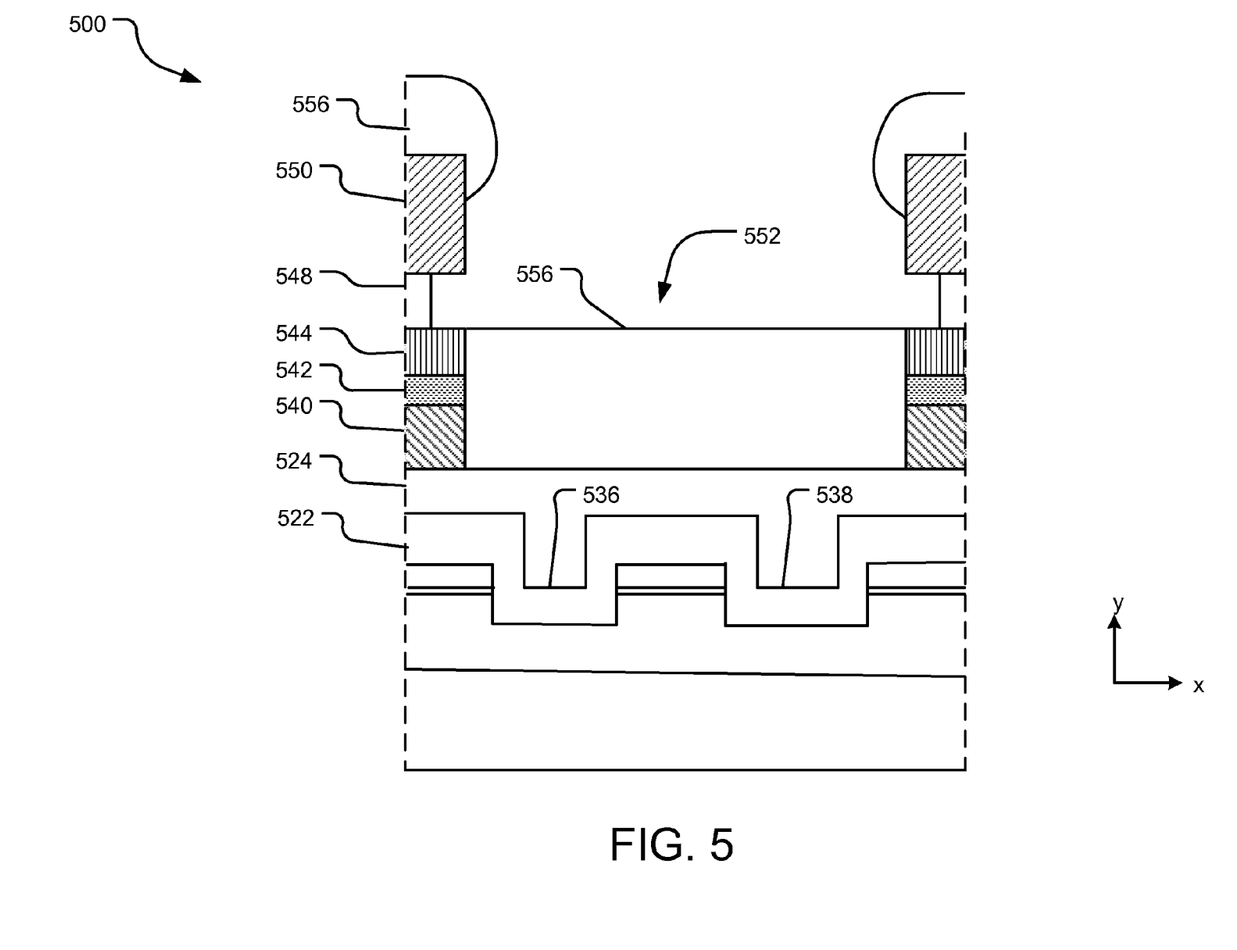
FIG. 5 illustrates yet another cross-sectional view of a semi-conductor wafer with a filler layer deposited across the wafer to fill a cavity that tunnels through a number of opaque layers.

FIG. 5 illustrates yet another cross-sectional view of a semi-conductor wafer 500 with a filler layer 556 deposited across the wafer 500 to fill a cavity 552 that tunnels through a number of opaque layers 540, 542, and 544. The cavity 552 was created in order to expose embedded alignment marks 536, 538 through another transparent layer 524, below. However, the formation of the cavity incidentally created unwanted surface topography. To solve this problem, the filler layer 556 was deposited.

The filler layer 556 is a transparent thin film that has a thickness (y-direction) approximately equal to the depth of the cavity 554. In one implementation, the filler layer 556 is blanket alumina that is approximately 30-150 nanometers thick (y-direction). In another implementation, the thickness of the filler layer 556 is greater than one micron. Prior to filling the cavity 552 with the filler layer 556, a soluble polymer layer 548 and overlying patterned photoresist layer 550 were formed on top of the opaque layers 540, 542, and 544. The patterned photoresist layer 550 and soluble polymer layer 548 are formed such that an area on the surface of the wafer is exposed having a perimeter that substantially encompasses the underlying alignment marks 536 and 538.

The patterned photoresist 550 and soluble polymer layer 548 prevent underlying portions of the underlying wafer 500 from contacting the transparent film layer 556 during the deposition process. After deposition of the filler layer 556, the soluble polymer layer 548 and overlying patterned photoresist 550 can be removed, such as by a standard photoresist solvent. This process, which may also be referred to herein as a "liftoff process", also removes portions of the filler layer 556 that are deposited on top of the patterned photoresist layer 550.

Figure 6:
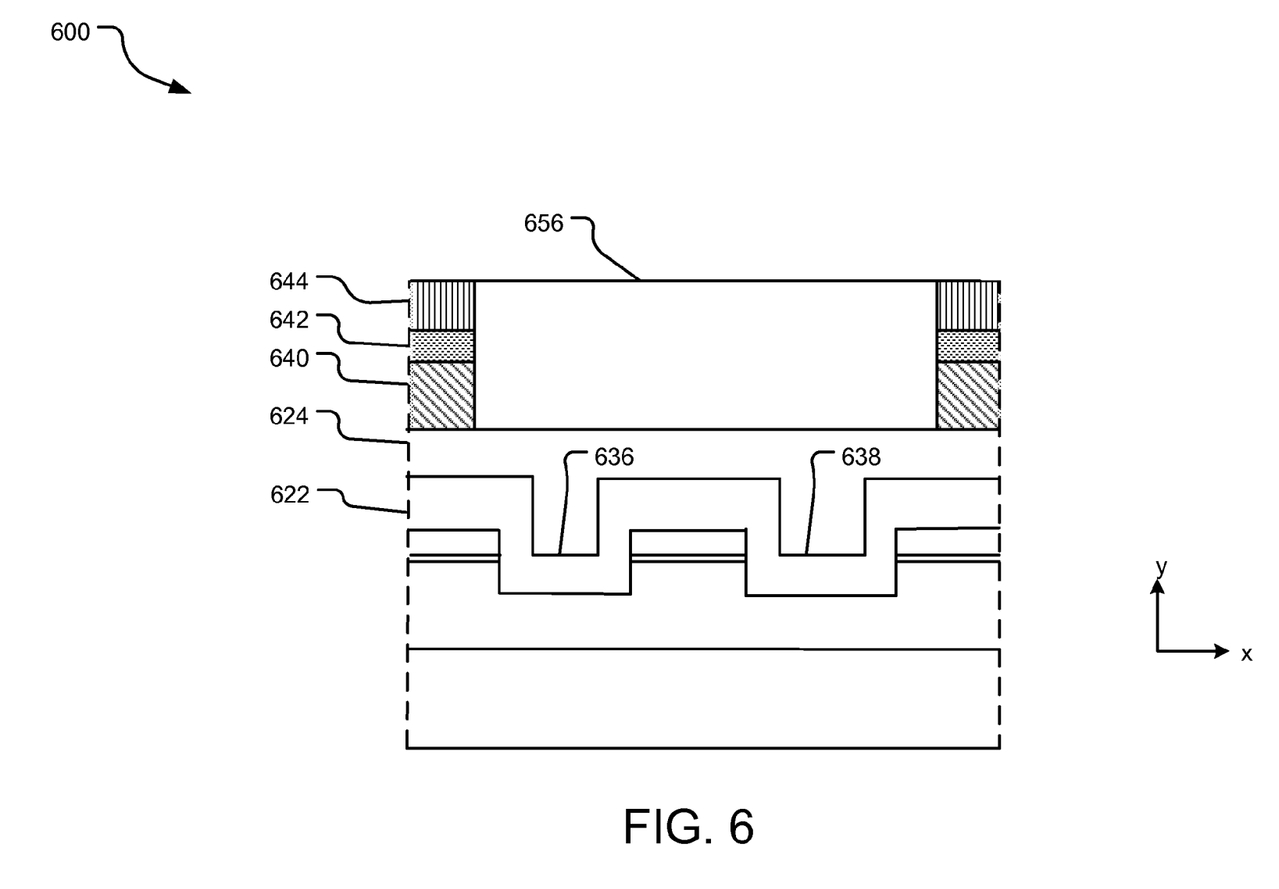
FIG. 6 illustrates yet another cross-sectional view of a semi-conductor wafer with alignment marks visible through transparent layers overlying the alignment marks.

FIG. 6 illustrates yet another cross-sectional view of a semi-conductor wafer 600 with alignment marks 636 and 638 visible through transparent layers 624 and 656 overlying the alignment marks 636 and 638. The transparent layer 656 was deposited in order to reduce surface topography created by etching or milling away the opaque layers 640, 642, 646. Subsequently, a patterned photoresist (not shown) and an underlying soluble polymer layer (not shown), such as those illustrated and discussed with respect to FIG. 5, were removed.

The semi-conductor wafer 600 has a substantially planar surface with the alignment marks 636 and 638 visible through the transparent layers 624 and 656. In one implementation, the steps described above with respect to FIGS. 2-6 are utilized in a single process, and the amount of topography remaining on the wafer after removal of the photoresist after can be polished without creating substantial variations in thickness across the wafer.

Figure 7:
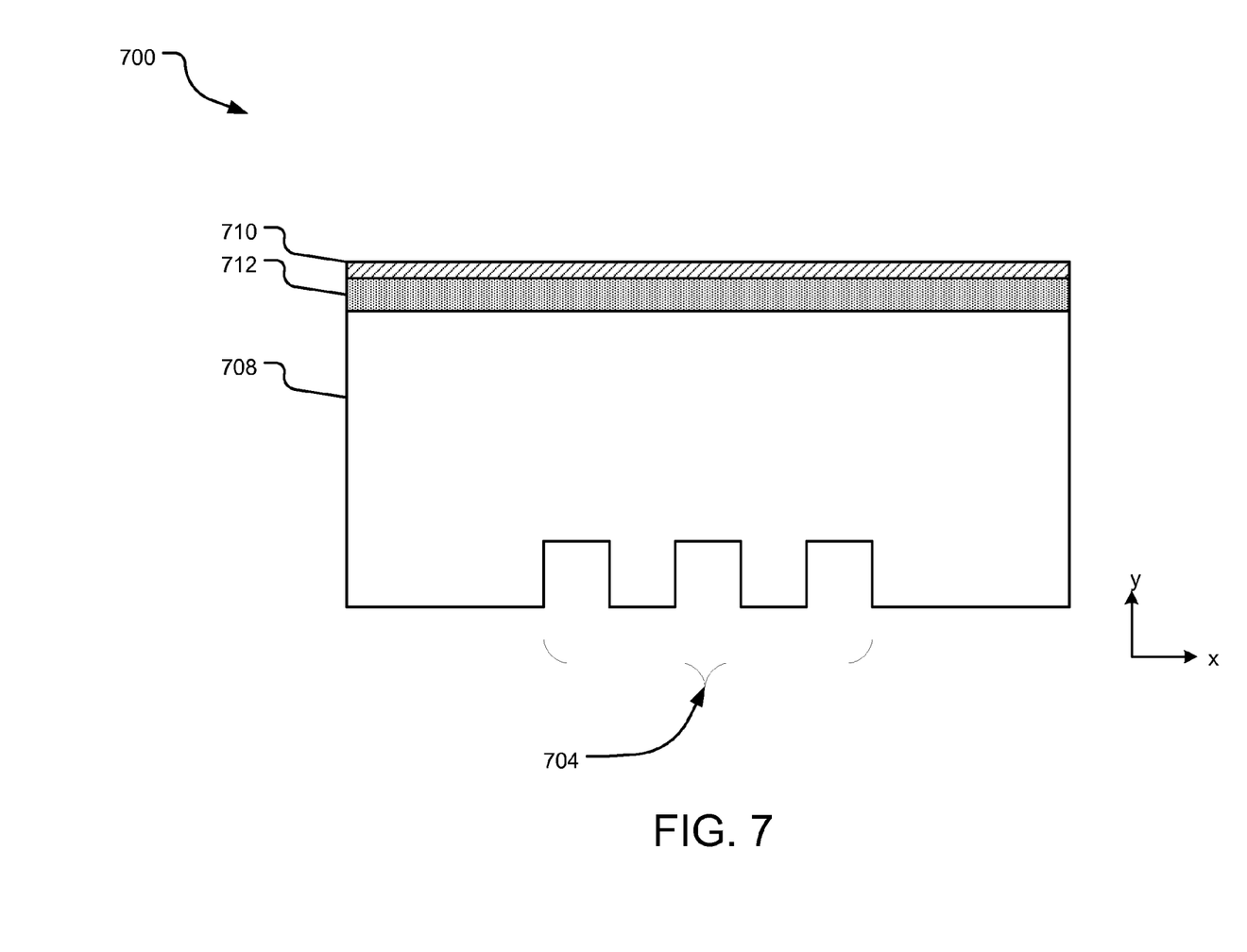
FIG. 7 illustrates a cross-sectional portion of a semi-conductor wafer taken along the x-y plane of FIG. 1.
Figure 8:
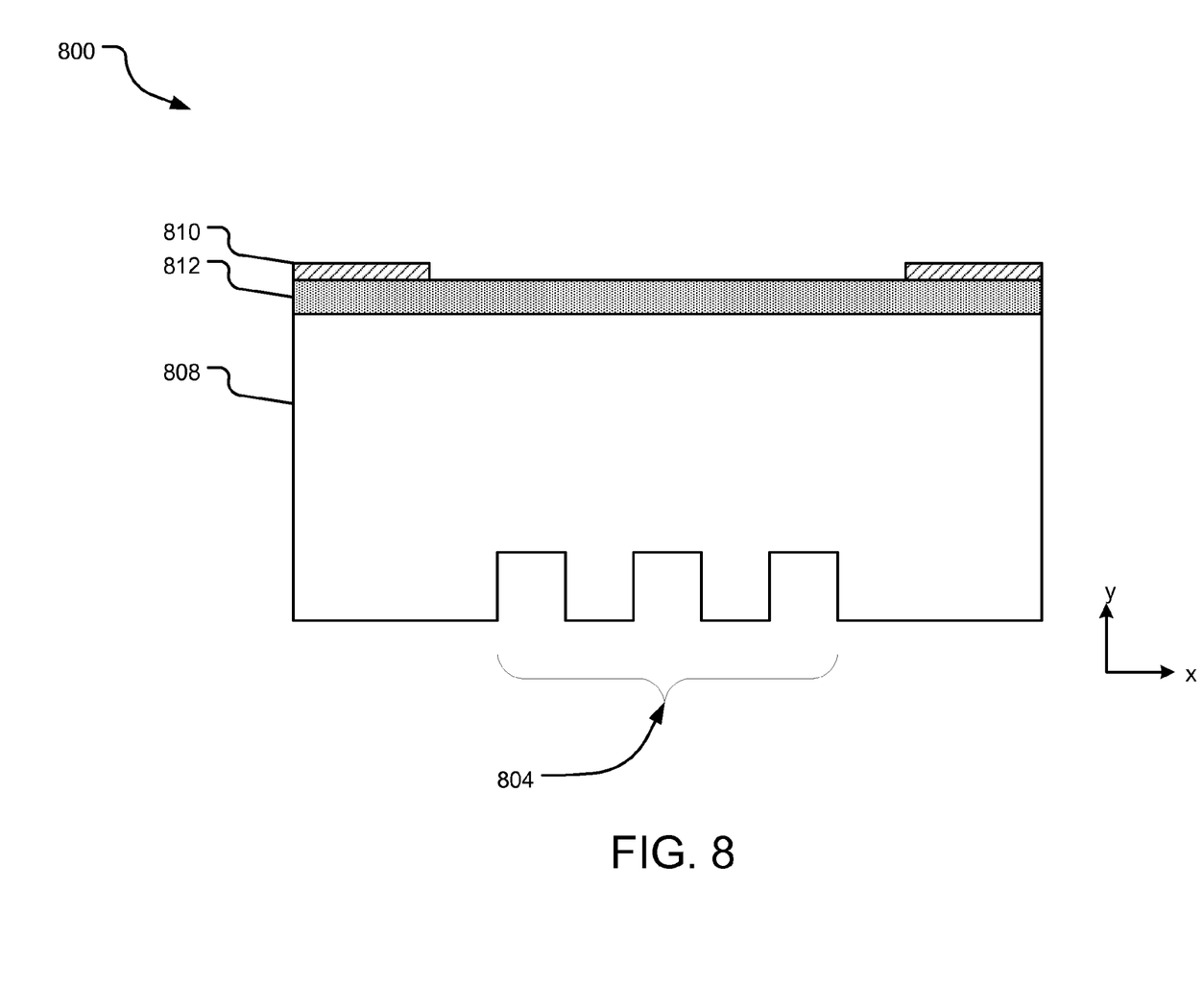
FIG. 8 illustrates a first alignment mark recovery process step wherein a portion of an upper opaque layer on a semi-conductor wafer is removed by a milling or etching operation.
Figure 9:
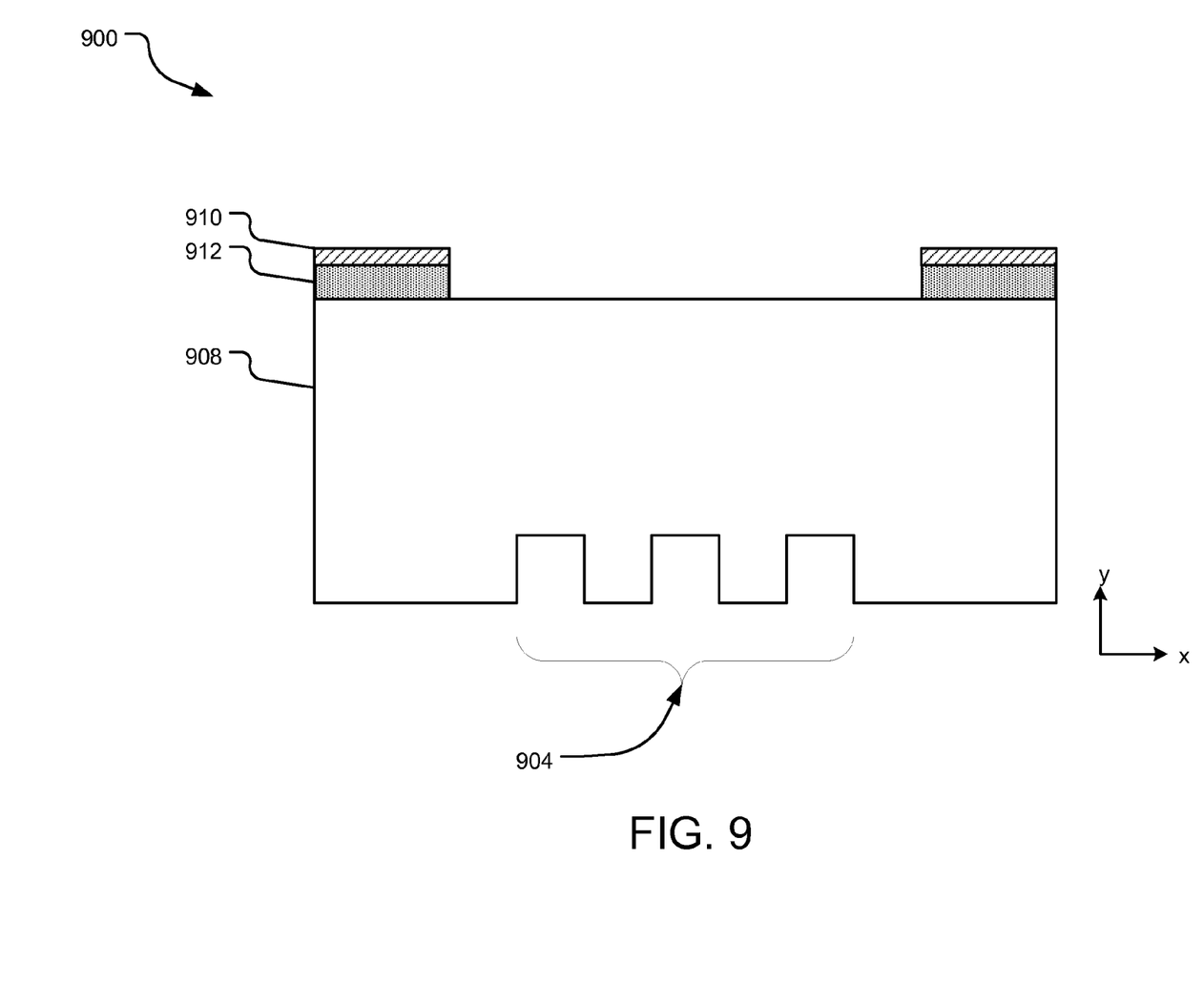
FIG. 9 illustrates another alignment mark recovery process step wherein a portion of a lower opaque layer on a semi-conductor wafer is removed by a selective removal process to expose alignment marks.

FIGS. 7-9 illustrate structures relating to implementations of another alignment mark recovery process. FIG. 7 illustrates a cross-sectional portion of a semi-conductor wafer 700 taken along the x-y plane of FIG. 1. The semi-conductor wafer 700 has a base portion (not shown), which may include, for example, a bottom substrate, a basecoat, and a variety of layers performing a variety of functions. Alignment marks 704 are formed on the base portion of the wafer as grooves in a metal layer (not shown). The grooves in the metal layer nest within grooves in an overlying transparent film layer 708. The transparent film layer 708 underlies first and second opaque layers 710 and 712. In one implementation, the opaque layers 710 and 712 are hardmask layers. In another implementation, the first opaque layer 710 is tantalum nitride (TaN) and the second opaque layer 712 is amorphous carbon (aC).

One or more removal steps can be undertaken to remove the opaque layers 710 and 712 from an area above the alignment marks 704, so as to expose the alignment marks through the transparent film layer 708. To avoid creating excess surface topography, one or more of the opaque material layers 710 and 712 is to be selectively removed.

FIG. 8 illustrates a first alignment mark recovery process step wherein a portion of an upper opaque layer 810 on a semi-conductor wafer 800 is removed by a milling or etching operation. The upper opaque layer 810 is above and in contact with a lower opaque layer 812, which is above and in contact with a transparent film layer 808. In one implementation, the upper opaque layer 810 is a hard mask material such as tantalum nitride (TaN). Alignment marks 804 are embedded in the wafer 800 just below the transparent film layer 808.

Prior to this milling or etching operation, the wafer is coated with a layer of liquid photoresist, which may be performed by a spin-coating process. The liquid photoresist is masked and exposed to a high intensity light to modify the solubility of portions of the photoresist. Thereafter, the, more soluble portions are removed by a developer solution so that the other hardened portions (i.e., the patterned photoresist) remain on the wafer, leaving behind a patterned photoresist that protects the portions of wafer that will not be subsequently etched or milled.

In one implementation, material from the upper opaque layer 810 is removed from an area above the alignment marks 804 by a short milling or etching process. In another implementation, such material is removed by a wet or dry etching process. In the same or an alternate implementation, the milling or etching operation that removes the upper opaque layer 810 also removes material from one or more other opaque and/or transparent layers on top of the transparent layer 808.

In any or all of the above implementations, some of the lower opaque layer 812 may be left behind on the wafer 800 to be subsequently removed by a selective etching or ashing process (such as that described with respect to FIG. 9, below).

FIG. 9 illustrates another alignment mark recovery process step wherein a portion of a lower opaque layer 912 on a semi-conductor wafer 900 is removed by a selective removal process to expose alignment marks 904 embedded in the wafer 900. The lower opaque layer 912 is above and in contact with the transparent film layer 908, which is selected to be a "stop" layer for the selective removal process.

Prior to removing material from the lower opaque layer 912, a patterned photoresist is created on the wafer to protect portions of the lower opaque layer 912 that will not be removed in the selective removal process. In one implementation, this patterned photoresist is formed before material is removed from one or more upper opaque layers (such as the opaque layer 910). Therefore, this same protective photoresist (not shown) may be left in place while material is removed from the lower opaque layer 912 as well.

At the alignment mark recovery process step illustrated by FIG. 9, a selective ashing or etching process is used to selectively remove opaque material from above the stop layer 908 without removing material from the stop layer 908 itself. In one example implementation, the stop layer 908 is transparent alumina, the lower opaque layer 912 is amorphous carbon (aC), and an ashing process is used to remove material from the lower opaque layer 912 above the alignment marks 904. In another implementation, the stop layer 908 is silicon dioxide, the lower opaque layer 912 is amorphous carbon, and a selective etch process is used to remove the material in the lower opaque layer 912 above the alignment marks 904. In another implementation, the stop layer is $SiO_2$ and a chlorine-based etch is used.

By selectively ashing or etching through the lower opaque film layer 912 as described above, no material from the transparent film layer 908 is removed. Therefore, the resulting topography on the surface of the wafer 900 is reduced as compared to some existing processes that overetch or overmill into the transparent layer 904 to remove the one or more overlying opaque layers.

Figure 10:
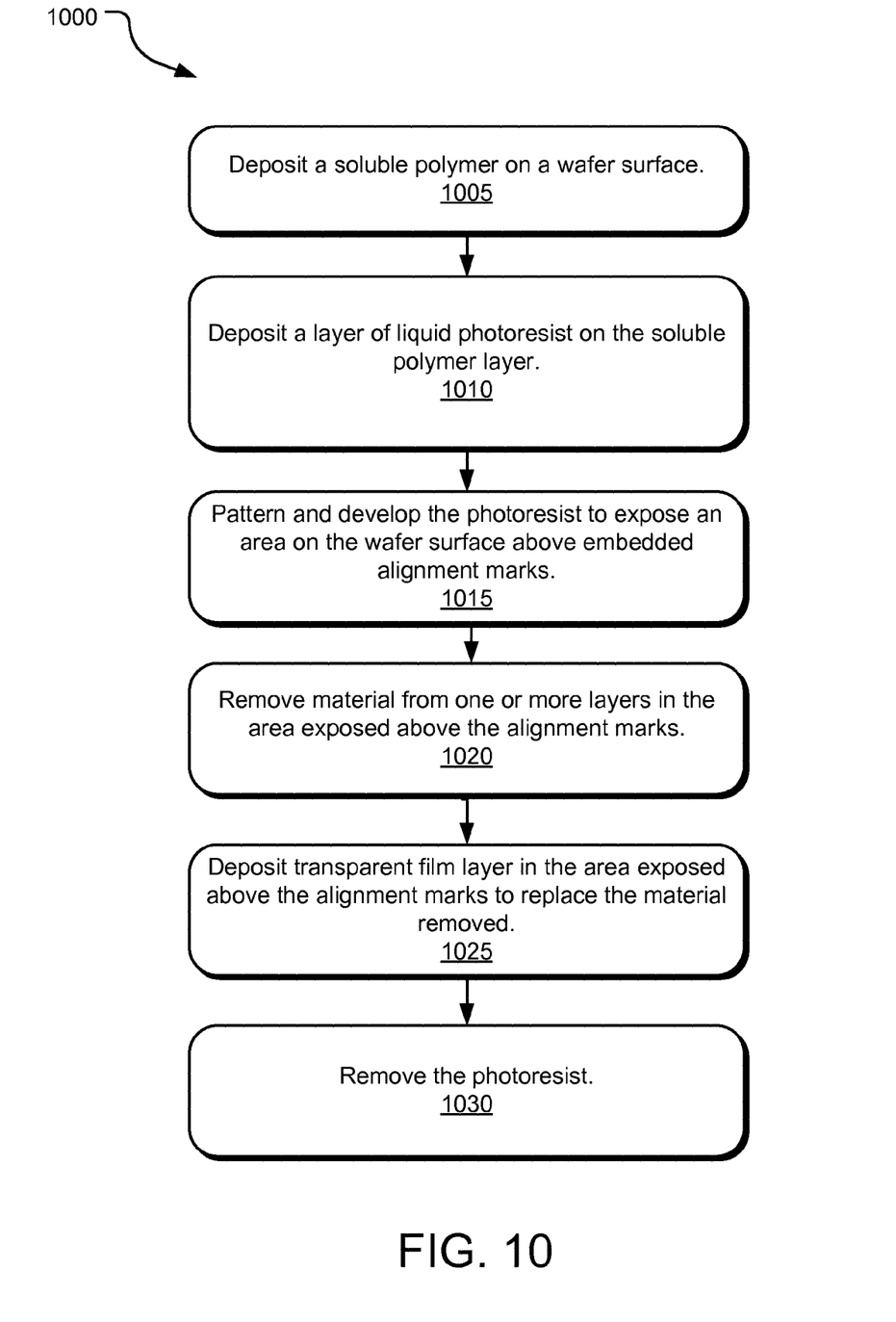
FIG. 10 illustrates a flow-chart of example operations for an alignment mark recovery process according to one implementation.

FIG. 10 illustrates a flow-chart of example operations for an alignment mark recovery process according to one implementation. A first deposition operation 1005 first deposits a soluble polymer on a semi-conductor wafer surface. The soluble polymer is preferably soluble in a developer solution used to develop away a photoresist. The deposition operation 1005 deposits the soluble polymer layer in a substantially even manner, such as by spin-coating the wafer. In one implementation, the soluble polymer is PMGI.

A second deposition operation 1010 deposits a layer of liquid photoresist on top of the soluble polymer layer, such that the liquid photoresist is in contact with the soluble polymer and deposited substantially evenly across the wafer. Like the first deposition operation 1005, the second deposition operation 1010 may also be performed by spin-coating the wafer.

A pattern and development operation 1015 patterns the photoresist to expose a portion of the wafer surface above one or more alignment marks embedded in the wafer. In one implementation, the pattern is created in the photoresist by an optical lithography patterning process. For example, a high intensity light can be directed through a patterned photo mask and subsequently through a lens that projects the pattern of the patterned photo mask onto the wafer surface. Depending on the type of photoresist utilized, this light exposure will modify the solubility of either the exposed or unexposed portions of the photoresist. The more soluble portions can be removed, such as by a developer solution.

The developed portions of the resist are located physically above one or more of the alignment marks embedded in the wafer. In removing these portions of the photoresist, the developer solution also isotropically dissolves portions of the soluble polymer layer underlying the developed portions of the photoresist, thus exposing an area on the wafer surface (hereinafter "the exposed area") that substantially encompasses one or more underlying alignment marks.

A removal operation 1020 removes material from one or more layers in the developed area in order to recover or expose the alignment marks underlying the developed area. In one implementation, material is removed from one or more opaque thin film layers. In another implementation, material is removed from both opaque thin film and transparent thin film layers. The removal operation 1020 may be either a milling or an etching operation that mills or etches a cavity into the exposed area of the wafer. After the removal or etching operation, the alignment marks are visible in the developed area. One or more transparent layers may separate the alignment marks from the surface of the wafer.

A filling operation 1020 fills the cavity etched or milled in the removal operation 1015 with a transparent film. In one implementation, this transparent film is deposited substantially evenly across the entire wafer. Thus, the transparent film coats the wafer surface and also the developed area (i.e., the base of the cavity etched or milled) above the alignment marks. The amount of film deposited on the wafer is substantially equal to the amount of material removed from the cavity. Therefore, the cavity etched or milled by the removal operation 1020 is "filled" to its original level with the transparent film.

After the filling operation 1020, the patterned photoresist is removed by a standard photoresist solvent, such as a resist-strip that chemically alters the patterned photoresist so that it no longer adheres to the substrate. The soluble polymer layer underlying the substrate is also removed by this solvent.

After the patterned photoresist is removed, the surface of the wafer is substantially coplanar with an original surface of the wafer (i.e., the surface existing prior to application of the soluble polymer layer).

Figure 11:
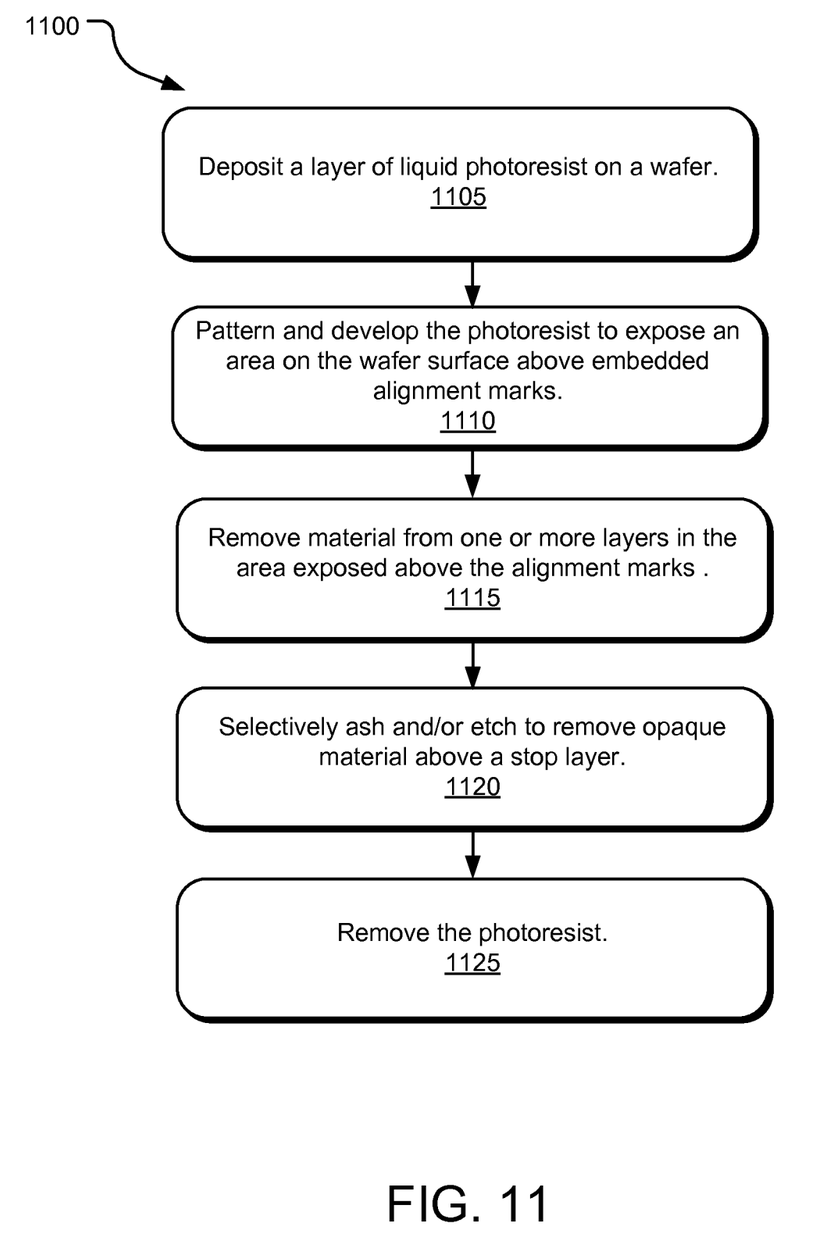
FIG. 11 illustrates another flow-chart of example operations for an alignment mark recovery process according to another implementation.

FIG. 11 illustrates another flow-chart of example operations for an alignment mark recovery process according to another implementation. A deposition operation 1105 deposits a layer of liquid photoresist on a semi-conductor wafer surface. The liquid photoresist is deposited in a substantially even manner across the wafer surface.

A pattern and development operation 1110 patterns the photoresist to expose a portion of the wafer surface above one or more alignment marks embedded in the wafer. In one implementation, the pattern is created in the photoresist by an optical lithography patterning process. For example, a high intensity light can be directed through a patterned photomask and subsequently through a lens that projects the pattern of the patterned photomask onto the wafer surface. Depending on the type of photoresist utilized, this light exposure will modify the solubility of either the exposed or unexposed portions of the photoresist. The more soluble portions are removed, such as by a developer solution, to expose an area (the "exposed area") that substantially encompasses one or more alignment marks embedded below the wafer surface.

A removal operation 1115 is either a milling or an etching operation that mills or creates a cavity in the exposed area of the wafer, removing material from at least one layer. The material removed may be either transparent or opaque. However, the removal operation 1115 leaves some opaque material remaining in the exposed area, so that the embedded alignment marks are not visible. One or more transparent layers may separate the alignment marks from the opaque material in the exposed area.

A selective removal operation 1120 selectively ashes or etches to remove the remaining opaque material overlying the alignment marks in the exposed area without removing any material from a stop layer below the opaque material. In one implementation, the stop layer is a transparent thin film layer. In the same or an alternate implementation, the opaque material is aC and the selective removal operation is an ashing process that ashes away the aC but does not remove any of the transparent thin film.

After the selective removal operation 1120, a photoresist removal operation 1125 removes the patterned photoresist by a standard photoresist solvent. After the photoresist removal operation 1125, the remaining surface topography on the wafer is not significant relative to the requirements of NIL.

The specific steps discussed with respect to each of the implementations disclosed herein are a matter of choice and may depend on the materials utilized and/or the topography-related requirements of a given system. The steps discussed may be performed in any order, adding and omitting as desired, unless explicitly claimed otherwise of a specific order is inherently necessitated by the claim language.

The above specification, examples, and data provide a complete description of the structure and use of exemplary implementations of the invention. Since many implementations of the invention can be made without departing from the spirit and scope of the invention, the invention resides in the claims hereinafter appended.

What is claimed is:

1. A method comprising:
creating a cavity by removing opaque material concealing an underlying alignment mark embedded in a wafer to expose the underlying alignment mark through a first layer of transparent material forming a base of the cavity;
filling the cavity with a second layer of transparent material to a depth substantially equal to a depth of the cavity;
aligning a template mask with the underlying alignment mark visible through the second layer of transparent material; and
pressing the template mask into contact with the second layer of transparent material.

2. The method of claim 1, further comprising:
forming a patterned photoresist above an opaque surface layer that leaves exposed an area of the opaque surface layer above the underlying alignment mark.

3. The method of claim 2, further comprising:
removing the patterned photoresist from the wafer.

4. The method of claim 1, wherein filling the cavity with the second layer of transparent material further comprises filling the cavity with transparent material to a height substantially coplanar with an edge of an opaque surface layer that is most distal to a base of the cavity.

5. The method of claim 1, wherein creating the cavity further comprises removing material by etching or milling the wafer.

6. The method of claim 1, wherein filling the cavity with the second layer of transparent material further comprises depositing a transparent thin film across a surface of the wafer.

7. The method of claim 1, wherein the underlying alignment mark is embedded in the first layer of transparent material.

8. The method of claim 1, wherein the cavity exposes a substantial margin on opposite sides of the underlying alignment mark.

9. A method comprising:
creating a cavity by removing opaque material concealing an underlying alignment mark embedded in a wafer to expose the underlying alignment mark;
filling the cavity with a first layer of transparent material to a depth substantially equal to a depth of the cavity;
aligning a template mask with the underlying alignment mark visible through the first layer of transparent material; and
pressing a template mask into contact with the first layer of transparent material.

10. The method of claim 9, wherein the underlying alignment mark is visible through a second layer of transparent material prior to the filling of the cavity and the method further comprises:
aligning the template mask with the underlying alignment mark.

11. The method of claim 9, further comprising:
forming a patterned photoresist above an opaque surface layer that leaves exposed an area of the opaque surface layer above the underlying alignment mark.

12. The method of claim 11, further comprising:
forming a soluble polymer layer on the opaque surface layer in contact with the patterned photoresist.

13. The method of claim 11, further comprising:
removing the patterned photoresist from the wafer.

14. The method of claim 9, wherein filling the cavity with the first layer of transparent material further comprises filling the cavity with transparent material to a height substantially coplanar with an edge of an opaque surface layer that is most distal to a base of the cavity.

15. The method of claim 9, wherein creating the cavity further comprises removing material over the underlying alignment mark by etching or milling the wafer.

16. The method of claim 9, wherein the underlying alignment mark is embedded in the transparent material.

17. The method of claim 9, wherein the cavity exposes a substantial margin on opposite sides of the underlying alignment mark.

\* \* \* \* \*